(12) United States Patent
Benner

(10) Patent No.: US 7,258,600 B1
(45) Date of Patent: Aug. 21, 2007

(54) VACUUM-ASSISTED PAD CONDITIONING SYSTEM

(75) Inventor: Stephen J. Benner, Lansdale, PA (US)

(73) Assignee: TBW Industries, Inc., Furlong, PA (US)

( * ) Notice: Subject to any disclaimer, the term of this patent is extended or adjusted under 35 U.S.C. 154(b) by 292 days.

(21) Appl. No.: 10/819,754

(22) Filed: Apr. 7, 2004

Related U.S. Application Data

(63) Continuation-in-part of application No. 10/447,373, filed on May 29, 2003, now Pat. No. 7,052,371.

(51) Int. Cl.
*B24B 19/00* (2006.01)

(52) U.S. Cl. .................. 451/72; 451/443; 451/444

(58) Field of Classification Search ............. 438/692, 438/693; 451/21, 36, 41, 56, 60, 63, 72, 451/443, 444, 456
See application file for complete search history.

(56) References Cited

U.S. PATENT DOCUMENTS

| | | | | |
|---|---|---|---|---|
| 5,916,010 A | * | 6/1999 | Varian et al. | 451/38 |
| 6,200,207 B1 | * | 3/2001 | Hsu | 451/443 |
| 6,331,136 B1 | * | 12/2001 | Bass et al. | 451/56 |

\* cited by examiner

*Primary Examiner*—Timothy V. Eley
(74) *Attorney, Agent, or Firm*—Wendy W. Koba

(57) ABSTRACT

A method and apparatus for conditioning polishing pads that utilize an apertured conditioning disk for introducing operation-specific slurries, without the need for additional tooling, platens, and materials handling. The method and apparatus utilize a vacuum capability to pull waste material out of the conditioning pad and through the apertured conditioning disk to evacuate the apparatus through an outlet port, the apparatus may also include self-contained flushing means and a piezo-electric device for vibrating the pad conditioning apparatus.

15 Claims, 11 Drawing Sheets

FIG. 5
PRIOR ART
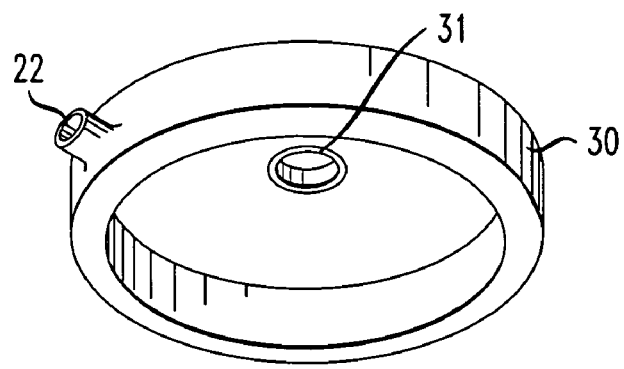
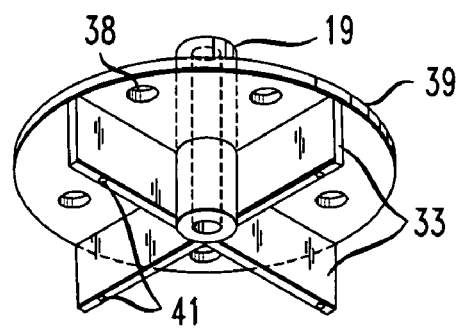
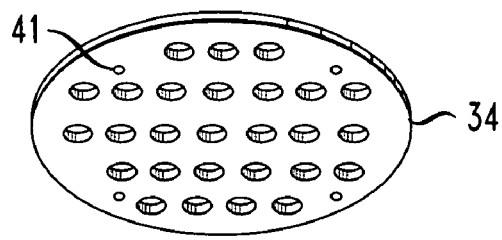
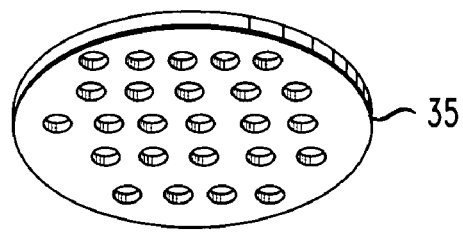
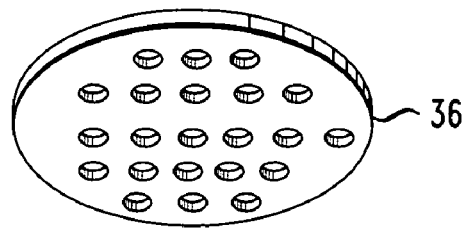

VACUUM-ASSISTED PAD CONDITIONING SYSTEM

This application is a Continuation-in-Part of U.S. application Ser. No. 10/447,373, filed May 29, 2003 now U.S. Pat. No. 7,052,371.

BACKGROUND OF THE INVENTION

1. Field of the Invention

The present invention relates generally to the fields of semiconductor fabrication, microelectromechanical systems (MEMS) fabrication, and precision polishing; and specifically to a method for the removal of waste products from the polishing process, and for the introduction of multiple, different slurries during Chemical Mechanical Polishing (CMP) and planarization.

2. Description of Related Art with Respect to Semiconductor Fabrication

An integrated circuit generally consists of a silicon wafer substrate typically produced or fabricated as a disc with a diameter of 100 to 300 millimeters and a thickness of 16 to 40 mils. Metallic, dielectric and insulator depositions forming interconnected circuits are created on a wafer by a series of processes, such as lithography, vapor deposition, and oxidation, that produce the desired electrical circuitry. An electrical insulating layer, up to one-micron in thickness, is then deposited over the electrical circuit layer. With each layer, a multiplicity of undesired irregularities occur on the surface. These irregularities are on the order of 0.05 to 0.5 microns. It is critically important that these irregularities be planarized, so that new layers of circuitry can be developed without loss of focus in lithography, whereby accurate interconnections can be formed between layers.

Various techniques have been developed and used to effect the removal of these irregularities. Chemical Mechanical Polishing (CMP) (planarity) process has become a key technology to remove irregularities and achieve required planarity, layer and line width geometries of microelectronic devices. A CMP system generally consists of the following components:

1) a polishing pad mounted on a rotating or orbital platen or belt;
2) a stream of polishing slurry (oxidizer and abrasive) whose chemistry and abrasive media is important to polishing performance;
3) large amounts of ultra pure water (UPW) used as a lubricant or flushing medium/agent;
4) slurry components and flushing agents. Additionally, to adjust chemistry or fluid properties during processing;
5) a diamond end effector which controls the surface condition and asperity profile of the polishing pad; and
6) the wafer to be polished mounted in a carrier on a rotating head which supplies the polishing pressure.

The introduction of slurry under the wafer, and the removal of waste products from the polishing and conditioning process, are dependent on the centrifugal force of the rotating pad, the action of the end effector, and the flow of slurry plus UPW.

Irregularities on the wafer are removed with a slurry of oxidating chemicals and very fine abrasive particles continually presented to its surface. Polishing or planarity is generally accomplished with the wafer placed face down on the polishing pad that is rotating beneath the wafer that is itself rotating around a central axis. Linear and orbital methods are also utilized and this invention is applicable to those processes and tools.

Current polishing tools and processes consist of a single operation step per platen because of operation with specific slurries. Additional tools, platens, and materials handling are required to support multi-step polishing operations such as that required for copper CMP.

There currently exists no means of using different chemicals, and abrasives of different materials or particle sizes, without separate equipment or extensive changeover and/or manual cleaning of the polishing equipment.

Polishing pads are generally made of a plastic (urethane) material. The removal rate of wafer irregularities is affected by the pressure applied to the wafer against the polishing pad, the relative speed of the slurry on the wafer, the amount of fresh slurry presented to the surface of the polishing pad, and the circuit pattern of the wafer. The introduction of slurry under the wafer, and the removal of waste products from the polishing process, are dependent on centrifugal force of the rotating pad, the action of the end effector, and the flow of slurry and components and UPW. This type of flushing does not always remove the waste. Large settled abrasive particles from the slurry, and agglomerated slurry and wastes, form in the pores and grooves of the pad, and between diamond particles on the conditioners. Commercial applications have large volumes of UPW used in production and significant amounts of wastewater that must be treated.

The rate of wafer polishing depends upon the pressure applied to the wafer, the slurry, and the diamond head on the end effector arm to roughen or condition the polishing pad, to provide a consistent asperity profile. In cross-section, the pad has regions of peaks and valleys which both carry slurry and provide pressure to the abrasive particles therein. The pad generally consists of a hard or soft urethane material with pores and/or fibers dispersed throughout the active layer. The fibers and/or urethane give the pad rigidity, provide pressure to the abrasive/wafer interface, and aid in the removal of material from the surface of the wafer. The pores act as a reservoir for the slurry facilitating the chemical contact and interaction with the wafer surface The chemical interaction is an important 'accelerator' over an abrasive-only polishing situation, and therefore is critical to overall process performance and control.

The diamond end effector generally consists of diamond particles embedded in a metal matrix in the form of a rotating disk. The disk is principally used to texture the polishing pad so that a sustainable rate of planarization can occur on the wafer and wafer to wafer. It is also used to remove used slurry and debris from the pad. The used slurry and debris often occurs as large hard agglomerations which consist of silicon dioxide ($SiO_2$), dielectric, and metals that become embedded in the polishing pad. These materials reduce removal or polishing rates and repeatability and can produce defects in the form of scratches that damage the wafer surface and device performance (opens, shorts). Data from the semiconductor industry reveal that 60% of chip loss is due to contamination. The CMP process has been reported to be a major source of this contamination.

The uncontrolled delivery and removal (flushing) of process fluids can also cause polishing waste to build-up on many surfaces within the tooling. When dislodged, these dried/agglomerated compounds can lead to additional defects. Slurry has proven to be "unstable", prone to agglomeration due to shear forces in delivery systems, heat, and age effects. There is also potential for diamond particles to fracture or be torn from the metal matrix of the end effector disk and scratch the wafer surface. Within typical polishing times, from 60 to 600 seconds, there is significant causal mechanisms for scratching and more control of the process is required.

Presently this debris is removed from the pad with copious flushing of the pad with UPW and/or slurry. This method relies on centrifugal force, or other pad movement dynamics, on the liquid to carry off the waste and agglomerates. This is a very uncontrolled method of removal because the flushing cannot break-up the static layer of slurry on the pad surface, nor is it able to dislodge the slurry in the holes of the pad. This could lead to additional agglomerates of slurry becoming deposited in holes and recesses of the pad. This slurry can become dislodged, at a later time, and damage subsequent wafers. The reliance of these "rotational forces" to present new slurry to the wafer/pad interface is also less controlled or repeatable than required, causing variation in removal rates and uniformity.

Polishing pad surfaces, which typically contain pores, holes or grooves for channeling the slurry between the wafer and the pad, require conditioning to create a consistent polishing interface. Slurry and debris from the wafer must be removed by continually "abrading" or "conditioning" the pad surface. Additionally, oxidizing slurries sometimes used in this process contribute to the contamination of the pad by interacting with device layer metals forming harder oxide compounds; or layer delaminations, causing potential contamination and scratching of the wafer.

One apparatus that attempts to solve the problems defined above is described in U.S. Pat. No. 6,508,697, incorporated herein by reference, in which a system for conditioning rotatable polishing pads used to planarize and polish surfaces of thin integrated circuits deposited on semiconductor wafer substrates, microelectronic and optical systems, is disclosed. The system is comprised of a pad conditioning apparatus, process fluids, and a vacuum capability to pull waste material out of the conditioning pad, self-contained flushing means, and a means for imparting a vibratory motion to the pad conditioning abrasive or fluids. The pad conditioning apparatus is comprised of an outer chamber in a generally circular configuration with an inlet port for introducing process fluids and/or UPW and an outlet port for supplying negative pressure.

Considering the prior art conditioning apparatus described above, it is an objective of the present invention to provide a method, using such system, for conditioning polishing pads with a self-contained cleansing means for removing debris and loose slurry, as it is dislodged during the conditioning process.

It is also an objective to provide means for the introduction of different (multi-step) operations with specific slurries or additives without additional tools, platens, and materials handling.

Another objective is to allow for neutralization of slurry chemistry between steps.

A further objective is to allow for the introduction of alternative/additional slurry or chemical feeds.

Yet another objective is to allow for multi-step polishing on each platen.

A still further objective is to increase through-put by allowing a more aggressive first polishing step, and subsequent, finer abrasive/chemical selectivity near the planarization endpoint.

Another objective is to eliminate intermediate material handling and to allow for single platen processing of copper and barrier metal films.

Yet another objective is to extend utility/life of single and double head polishing tools.

Yet another objective is to reduce defectivity through more selective endpoint control via slurry change (chemistry or abrasive).

Yet another objective is to improve uniformity by reducing handling/alignment/fixture variations seen by wafer.

BRIEF SUMMARY OF THE INVENTION

The pad conditioning system used in the present invention, as set forth in U.S. Pat. No. 6,508,697 referred to above, utilizes abrasive disks that have an open structure to collect debris or swarf as it is being abraded off of the substrate surface. The system has a pad conditioning apparatus, process fluids, a vacuum capability to pull waste material out of the conditioning pad, self-contained flushing means, and a piezo-electric device for vibrating the pad conditioning abrasive. The debris, as it is being created, is pulled through the holes of the abrasive and magnetic support, into a chamber behind the support, and into a conduit to a disposal system. Jets of water, other cleaning or neutralizing chemicals are sprayed through the abrasive in conjunction with the waste removal. This flushing/abrading/vacuum cleaning thoroughly cleans the polishing pad surface, enabling alternative materials to be introduced without cross contamination. All of these elements combine in operation to provide a unique and effective system for conditioning and cleaning polishing pads. They also allow for the introduction into the conditioning, cleaning and polishing processes operation-specific slurries or other chemicals, without the need for extensive retooling, platen change-out, and additional material handling.

The pad conditioning apparatus has an outer chamber in a generally circular configuration with an inlet port for introducing process fluids and/or UPW, and an outlet port for attaching negative pressure. The outer chamber houses a rotating impeller assembly with impeller blades radiating outward from the impeller shaft. The shaft of the impeller assembly protrudes through an opening in the top surface of the outer chamber and is attached to the equipment's end effector assembly. A support disk, a magnetic disk or mechanical fastening means, and an abrasive conditioning disk, are attached to the impeller in a stacked configuration. As described in U.S. Pat. No. 4,222,204, incorporated herein by reference, the abrasive disk is held in place magnetically or mechanically, offering full support of the disk, because it pulls the disk flat to the support disk. The assembly is constructed with aligned holes that allow debris on the polishing pad to be vacuumed up through these holes.

In operation, the outside chamber is held stationary with an attached hose connected to a vacuum facility. The water or slurry is introduced either from an inlet port on the outer chamber, or from the center of the impeller through a water collar.

A series of pressurized water holes radiating out from the center of the impeller disk allows full coverage of the abrasive disk and aids in the break up of the static layers in the pores of the polishing pad. The vacuum action pulls the water and debris immediately up through the aligned holes in the support, magnetic, and abrasive disks, and the rotating impeller blades sweep the water and debris into the vacuum pickup outlet and into the disposal system. The aligned holes, or "open structure", in the stacked disks allows collection of debris or swarf, as it is being dislodged from the surface of the pad, allowing continuous conditioning and cleaning without interference of the debris between the abrasive disk and the surface of the wafer. The magnetic fastening structure allows for rapid changeover and provides controlled flatness for the abrasive. A mechanical method can also be used which would be gimbaled for alignment and cushioning. Vacuum pulls the wastes from the process, and lifts the polishing pad asperities into an uncompressed position. Select holes also introduce process fluids, such as cleaning chemicals, slurry, passivating agents, complexing agents, surfactants, and UPW, and even cleaning gasses, to the pad in a much more controlled (pressure, location, sequence, and pad/wafer surface conditions, for instance) fashion.

A self-contained flushing system provides water to loosen and flush the debris up the disks holes into the impeller chamber and on through to the disposal system. A sealed bearing at the top of the outer chamber prevents water or process fluids from escaping. This flushing method also reduces the amount of UPW that is presently needed to flush the polishing pad. This saves on costly slurry, the volume of UPW, and the expensive waste disposal.

The impeller provides firm backing for the magnetic disk or mechanical fastening and abrasive disk. The magnet is secured to the support disk mechanically or by an adhesive. The abrasive disk is either magnetically or mechanically secured to the support disk. This system allows for periodic cleaning of the pad conditioning apparatus, as well as periodic replacement of the magnet and abrasive disks, without the need to disassemble the entire outer chamber and inner impeller assembly, which would incur extensive down time.

A piezoelectric transducer is provided near the free end of the end effector arm or fluid stream. When excited with a high frequency voltage, transducer imparts a low amplitude vibration to the pad conditioning apparatus, further enhancing the breakup and removal of the static layer of slurry on the polishing pad surface. A small vertical force imparted by the end effector arm on the polishing pad also aids in breaking up glazing of the slurry, and aids in dislodging particles wedged in the polishing pad surface.

BRIEF DESCRIPTION OF THE DRAWINGS

FIGS. 1 through 5 illustrate the prior art system of U.S. Pat. No. 6,508,697.

FIG. 1 is a perspective view of the major elements of the Chemical Mechanical Polishing (CMP) system used in the present invention with the wafer holder removed.

FIG. 2 is a top schematic view of the constituent components used in the present invention.

FIG. 3 is a view of the outer chamber taken along line 6-6 of FIG. 2.

FIG. 4 is a section view of the conditioning apparatus used in the present invention taken along line 7-7 of FIG. 2.

FIG. 5 is an exploded view of the constituent components of the conditioning apparatus used in the present invention showing the outer chamber and impeller assembly.

DETAILED DESCRIPTION OF THE PRESENT INVENTION

The present invention relates to a method of conditioning polishing pads used in Chemical Mechanical Polishing or Planarizing (CMP) Systems for removing irregularities on semiconductor wafer substrates. The specific details of the preferred embodiment provide a thorough understanding of the invention; however, some CMP system elements which operate in conjunction with the present invention have not been elaborated on because they are well known and may tend to obscure other aspects that are unique to this invention. It will be obvious to one skilled in the art that the present invention may be practiced without these other system elements.

Figure 1:
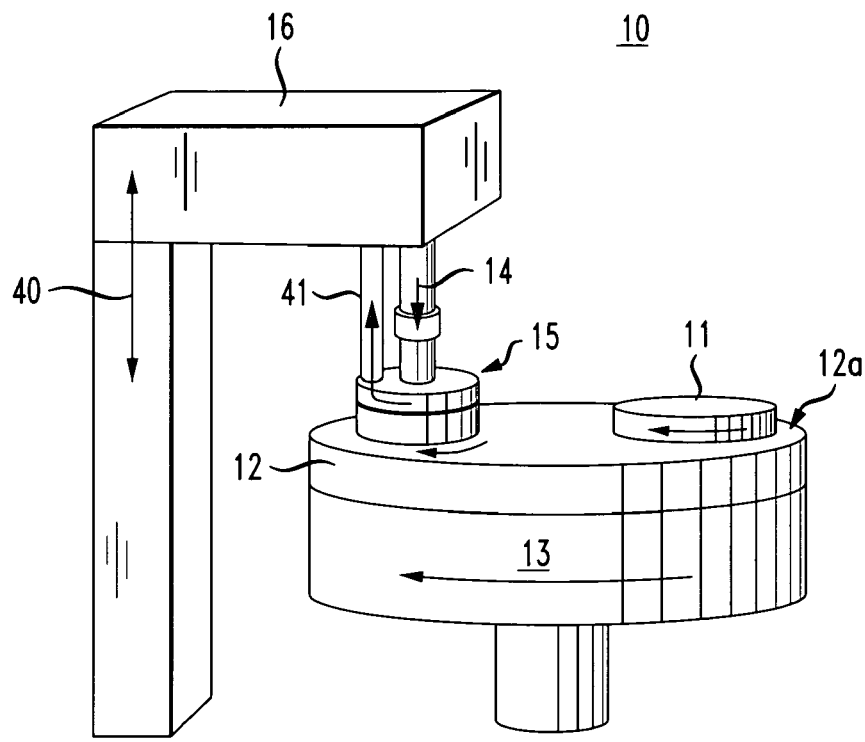
Figure 2:
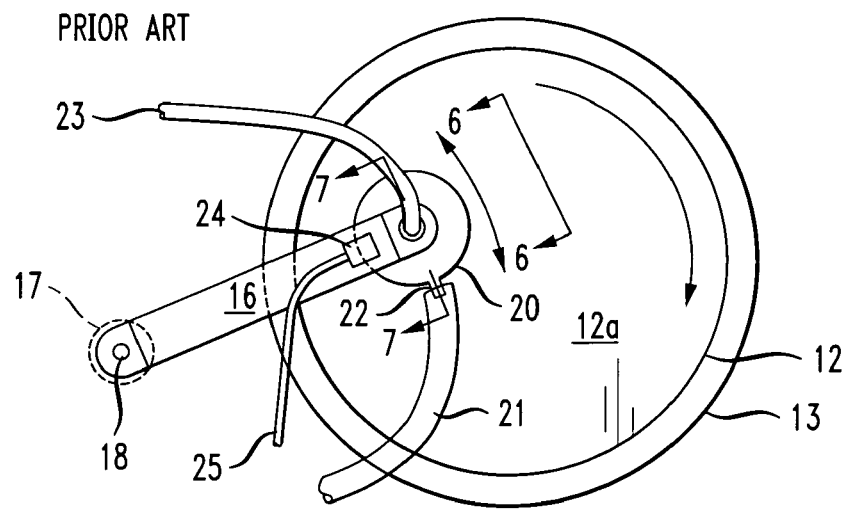

Referring to FIG. 1, a perspective view of a typical CMP system 10 is illustrated generally comprising a polishing head (not shown) that applies pressure to wafer 11 against a polishing pad 12 through a wafer carrier and support arm (not shown), and a polishing pad conditioning apparatus 15. Wafer 11 is rotated on polishing pad 12 that is secured to rotating, orbital or linear platen 13. (The wafer carrier, support arm and motor are not shown). A stream of polishing slurry 14 generally containing an oxidizer, abrasive and/or ultra-pure water (UPW) is poured on the polishing pad surface 12*a* and in cooperation with the rotating motion of wafer 11 acts to remove a few tenths of microns of surface unevenness on wafer 11 after each layer of integrated circuit fabrication. Pad conditioning apparatus 15 operates to restore and maintain polishing pad surface 12*a* as it is changed by the polishing action. Motor 17, as seen in FIG. 2, pivots end effector arm 16 in an arc about fixed shaft 18 while simultaneously providing rotational motion and a downward force 40 to pad conditioning apparatus 15. Debris from the polishing operation is removed through outlet 41.

A pad conditioning apparatus 15 used in the present invention is shown in the top view of FIG. 5 and is configured to mechanically and electrically interface with end effector arm 16. Pad conditioning apparatus 15 is designed to automatically dispense chemicals, slurry and/or UPW, so as to condition polishing pad surface 12*a* and vacuum out debris formed by the polishing process, without interfering with the polishing process or incurring excessive down time. Hose 21, which is attached to vacuum outlet port 22, on the periphery of conditioning holder 20, pulls debris into a vacuum facility (not shown). Hose 23, which is attached to input port 19 projects through the top center of conditioning holder 20 and provides a stream of abrasive slurry for consistent coverage of the pad surface 12a, and/or provides neutralizers, UPW, or cleaning agents, for flushing and lubrication. To enhance debris removal, piezo-electric device 24, when excited with a high frequency voltage through electrical connection 25, imparts a low amplitude vibratory impulse to conditioning apparatus 15, thereby agitating debris particles on conditioning pad surface 12a, causing the debris particles to become dislodged for easier removal.

Figure 3:
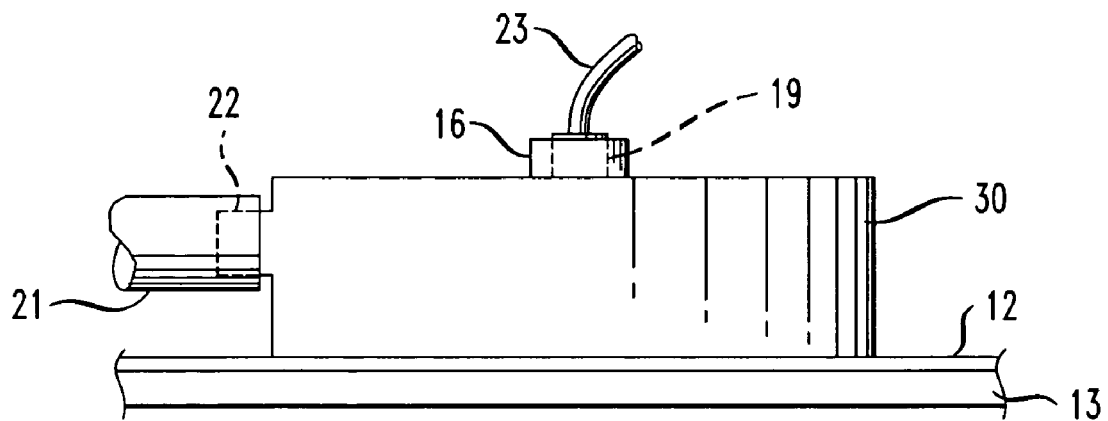

Outer chamber 30 of conditioning holder 20 shown in FIG. 3 is a view taken along line 6-6 of FIG. 2. Outer chamber 30 of the current embodiment, is approximately four inches in diameter and three inches high. It will be obvious to one skilled in the art that the present invention may be practiced with dimensional characteristics other than those described, up to and inclusive of the entire working surface of the pad.

Figure 4:
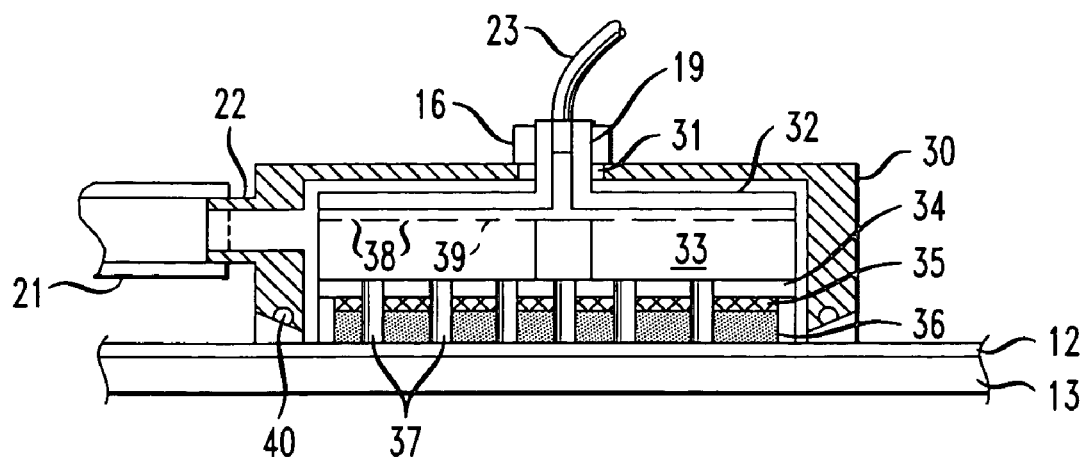

FIG. 4 is a sectional view taken along line 7-7 of FIG. 2, and shows the impeller assembly 32 with support disk 34, magnetic disk 35, and abrasive disk 36, attached to impeller blades 33. Holes 37 in each of the disks are aligned, such that debris is pulled from polishing disk 12 to vacuum outlet 22. Process fluid is taken in through hose 23 and evenly distributed through outlets 38 in impeller disk 39, to polishing pad 12, through holes 37. Seal 31 between outer chamber 30 and impeller shaft 19 prevents process fluid from escaping. An annular channel 40, in outer chamber 30, can provide a secondary means of introducing process and flushing fluids to polishing pad 12.

FIG. 5 is an exploded view that more clearly shows the constituent parts of conditioning apparatus 15 with screw attachment holes 41 securing support disk 34 to impeller blades 33. Although only four impeller blades 33 are shown in this view, other impeller blade configurations, including non-rotating "BAR"/chamber configurations, will provide the same function as that described in this embodiment.

Figure 7:
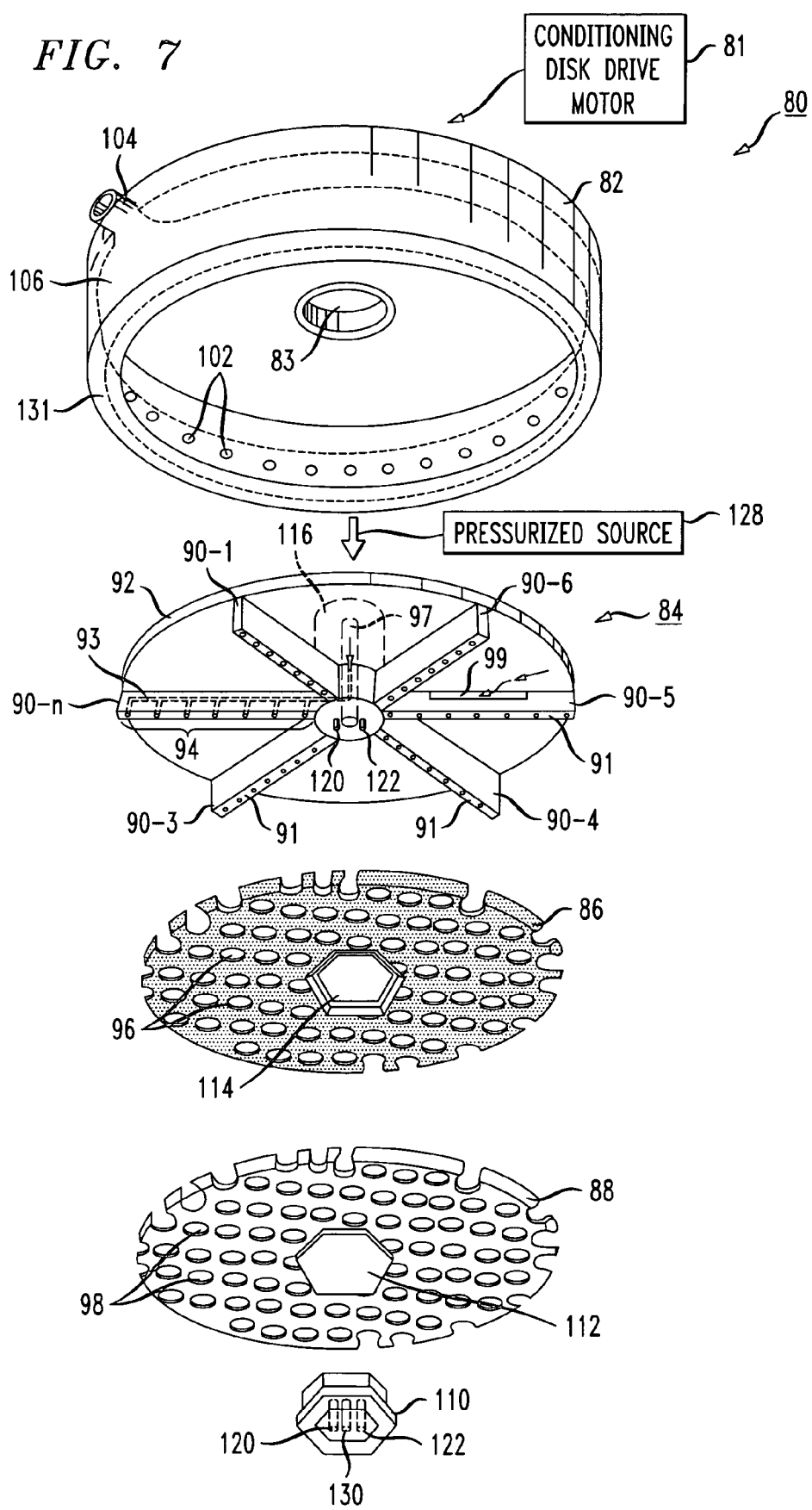
FIG. 7 is an exploded view of an inventive impeller arrangement formed in accordance with the present invention.

FIG. 7 illustrates, in an exploded view, an improved impeller arrangement 80 formed in accordance with the present invention. As shown, impeller arrangement 80 comprises an outer chamber 82, an impeller assembly 84, a magnetic disk 86 and a conditioning disk 88. It is to be understood that the use of a magnetic disk (or, in general, any type of "support" for conditioning disk 88) is considered optional, where in the alternative a (thicker) conditioning disk 88 would be coupled to impeller assembly 84 without an intervening support member. Further, the use of an outer vacuum chamber 82 is considered as only one exemplary embodiment of a vacuum supply system. Alternatives coupled directly to the impeller assembly without the need to encase the entire arrangement are possible and considered to fall within the spirit and scope of the present invention.

As with the arrangements described above, conditioning disk 88 includes a fine diamond grit for mechanically removing waste material from a polishing pad (not shown). An improvement associated with arrangement 80 of the present invention is the use of an innovative impeller assembly 84 for the application of one or more conditioning agent(s) to a polishing pad. Impeller assembly 84 serves to provide spraying apertures for the application of conditioning agent(s) and channels or sections for waste material removal. In accordance with the present invention, the conditioning agent(s) may comprise a slurry of a specific chemistry (to assist in removing contaminants from the polishing pad via a chemical reaction), ultra-pure water (UPW) or air to "flush" contaminants from the conditioning pad, any other suitable fluid or gaseous agent, or any combination thereof.

Figure 8:
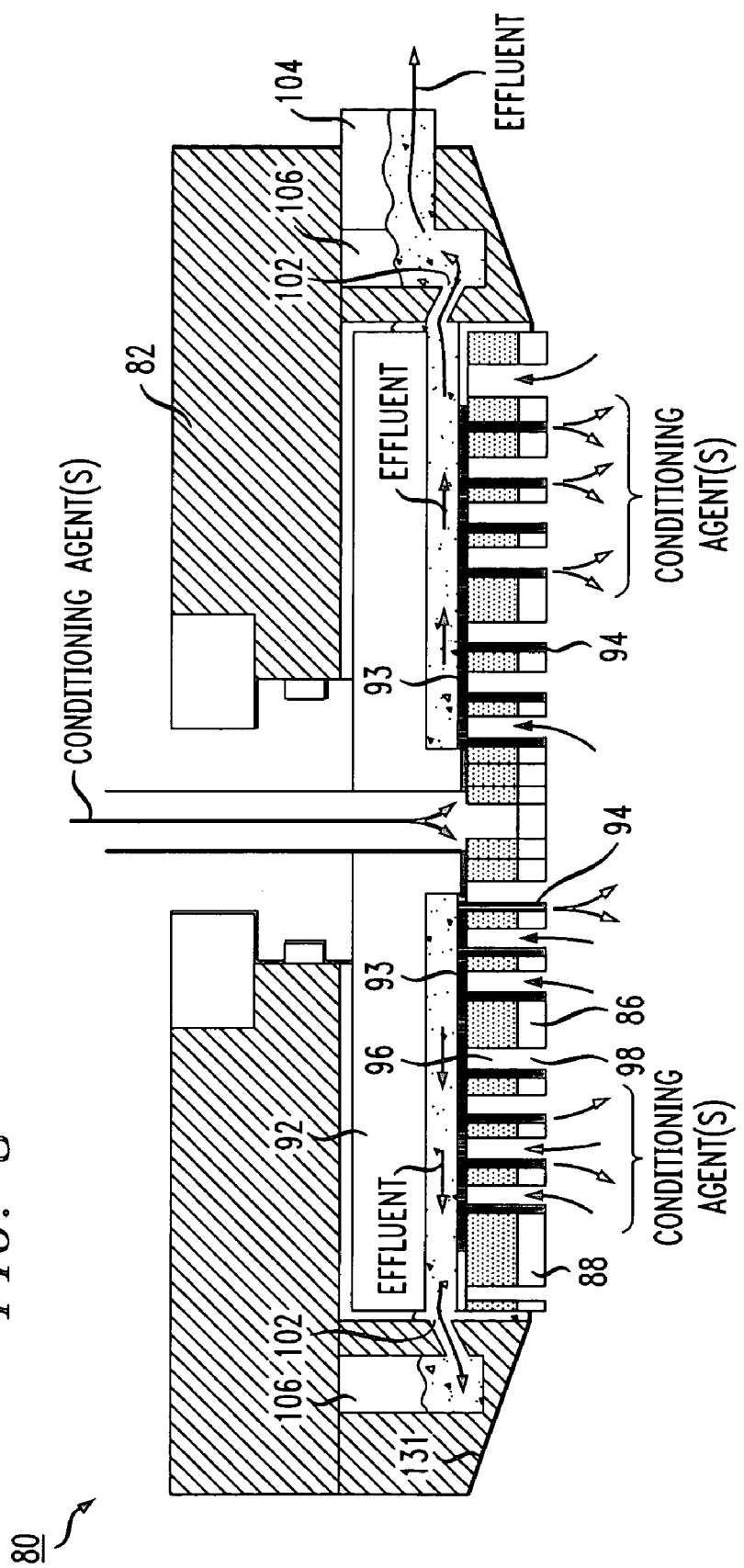
FIG. 8 is a cut-away side view of the impeller arrangement of FIG. 7.

Referring to FIG. 7, a plurality of impeller blades 90-1 through 90-6 are shown as attached to an upper holding member 92 of impeller assembly 84. It is to be understood that this configuration is exemplary only and, in fact, an impeller arrangement of this embodiment of the present invention may include only a single impeller blade. An exemplary impeller blade 90-$n$ is shown as including a plurality of apertures 94 along its bottom surface 91, through which the conditioning agent(s) is/are introduced to the system. In the most general case, a single aperture 94 may be formed on bottom surface 91, where a plurality of such apertures 94 is considered to be preferred for most embodiments. In systems that include a plurality of impeller blades, one or more of the blades may include these apertures 94. With respect to FIG. 7, impeller blade 90-$n$ includes a channel system 93 formed within impeller blade 90-$n$ and terminating at each aperture 94. As discussed above, conditioning agent(s) is/are introduced through an inlet port 83 of outer housing 82. The conditioning agent then passes through an opening in center member 97 of impeller assembly 84 and is then introduced to each channel system 93, as shown in FIG. 7. The conditioning agent flows along channel 93 and exits impeller assembly 84 at each aperture 94, for example, as a "spray" of liquid material. The conditioning agent will then pass through apertures 96 in magnetic disk 86, and apertures 98 in conditioning disk 88 so as to be dispersed across the surface of the polishing pad. FIG. 8 is a cross-sectional view of the inventive impeller assembly 80, illustrating in particular the interaction of the various components discussed above to provide for the application of a conditioning agent to a polishing pad. It is an advantage of the present invention that the use of a plurality of apertures 94 on at least one impeller blade 90-$n$, coupled with the rotational movement of impeller assembly 84 (as indicated by the arrows in FIG. 7), provides for improved coverage of the conditioning agent on the polishing pad surface, thereby allowing for more contaminant to be removed and for the conditioning process to be more efficient. This rotational movement of impeller assembly 84 is controlled by an abrasive conditioning disk drive motor 81, as shown. As will be discussed hereinbelow, a torque measurement instrument may be used in conjunction with drive motor 81 to analyze the applied rotational torque and determine parameters such as, but not limited to, the thickness of the polishing pad (i.e., an aging measurement). In one embodiment of the present invention, the temperature of the conditioning agent may be controlled as desired. For example, the temperature of a conditioning slurry may be controlled so as to control the rate of chemical reaction between the polishing pad and the conditioning slurry. Alternatively, the temperature of the conditioning agent may be controlled to reduce the heat created by the conditioning process itself.

In accordance with one embodiment of the present invention, spent conditioning agent(s), polishing slurry, contaminants, debris, etc. (hereinafter referred to as "effluent") may be removed using a vacuum process. A plurality of vacuum ports 102 are illustrated in FIG. 7 as formed around the inner periphery of outer housing 82. A vacuum coupling 104 is formed on the outer surface of outer housing 82 and coupled to a vacuum source (not shown). Housing 82 includes a vacuum channel 106 within its walls that is coupled to vacuum ports 102 so that as a vacuum is applied at outer port 104, a vacuum will start to draw through ports 102, and then through apertures 96 and 98 of magnetic disk 86 and conditioning disk 88, respectively. Advantageously, the use of the apertured disks 86 and 88 allows for a significant portion of the effluent to be efficiently evacuated through the relatively large number of aligned openings formed in the combination of disks 86, 88.

Figure 9:
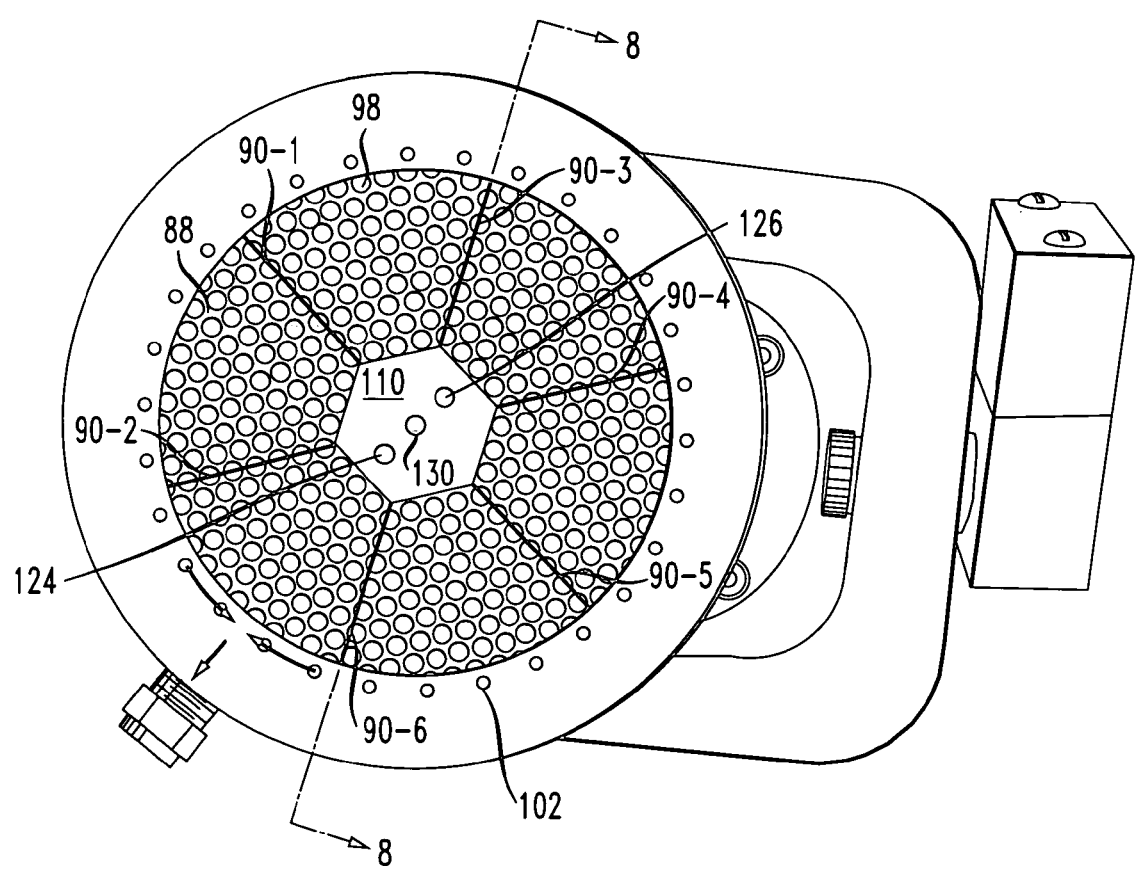
FIG. 9 is an isometric bottom view of the impeller arrangement of FIG. 7.

In the particular embodiment as shown in FIG. 7, a set of six vacuum regions are formed, with impeller blades 90-1 through 90-6 serving as barriers between adjacent vacuum regions. FIG. 9 is a bottom, isometric view of an exemplary conditioning system of the present invention, particularly illustrating the formation of the different vacuum segments, where FIG. 8 illustrates the path the effluent will traverse above magnetic disk 86, through vacuum ports 102, into vacuum channel 106 and thereafter exiting through outer vacuum port 104.

Figure 10:
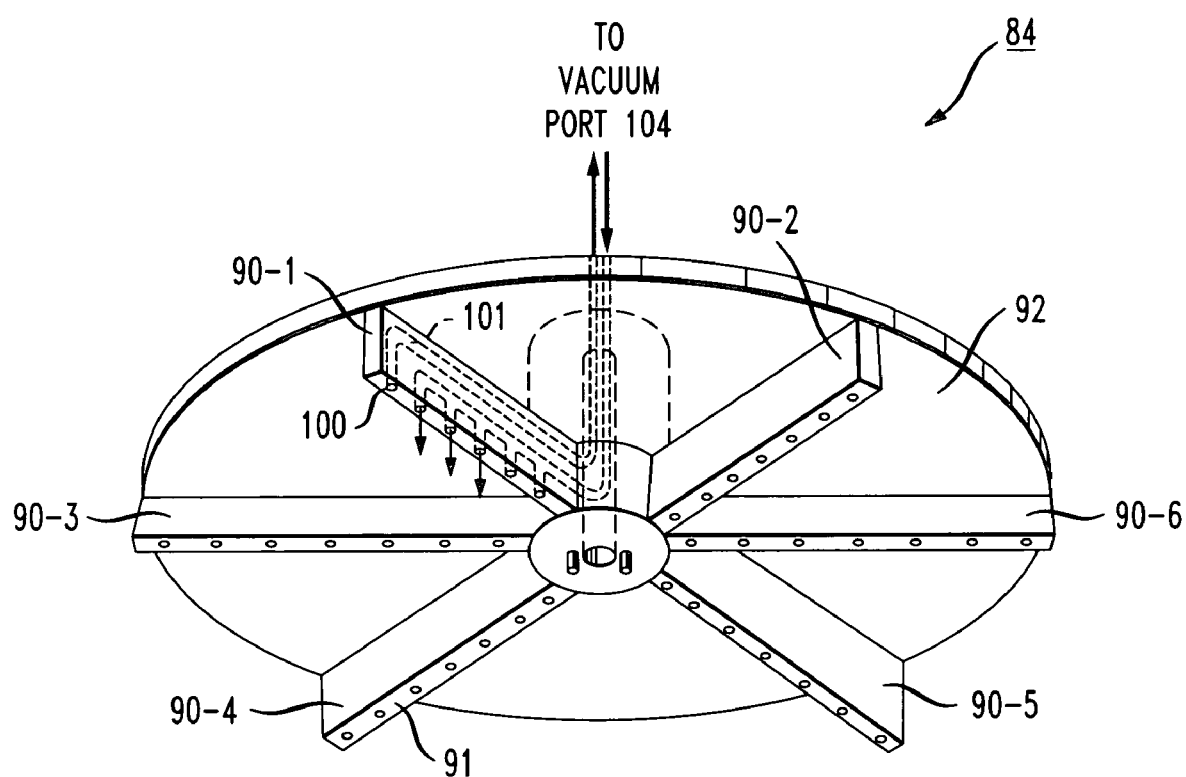
FIG. 10 illustrates an alternative impeller assembly of the present invention, including at least one vacuum port in an impeller blade.

In an alternative embodiment, as illustrated in FIG. 10, impeller assembly 84 may be configured to include at least one vacuum port 100 formed on bottom surface 91 of at least one blade 90-*n*, where in the alternative a plurality of such vacuum ports are included on at least one blade 90-*n*. In order to easily remove larger particles of debris and contaminant, vacuum port 100 may have a larger opening than apertures 94 formed on the same blade 90-*n*. Referring to FIG. 10, vacuum ports 100 are illustrated as coupled to a vacuum channel 101 along the top interior portion of impeller blade 90-*n*, such that the effluent from the pad surface may be pulled out through vacuum ports 100, pass through channel 101, and thereafter be directed to the same or similar outer vacuum port 104 (as shown in FIG. 7). In accordance with the present invention, the rotation of impeller assembly 84, coupled with the application of a vacuum through a number of different vacuum ports 100, allows for a significant amount of effluent to be removed quickly and efficiently.

It is to be understood that there may be occasions where an impeller arrangement of the present invention is configured only to apply a conditioning agent to a polishing pad (i.e., does not include any vacuum ports or vacuum evacuation system), or configured only to evacuate effluent from the polishing pad surface through the inventive apertured conditioning disk (using any other technique to apply conditioning agents to the polishing pad surface). In either instance, an impeller arrangement of the present invention is configured to include the appropriate apertures/vacuum ports to be used as discussed above.

Another advantage of the improved impeller arrangement 80 of the present invention is the use of a central locating key 110 for properly aligning magnetic disk 86 and conditioning pad 88 (or only pad 88 in systems without a support disk) with impeller assembly 84. In the arrangement as illustrated in FIG. 7, a central locating key 110 is configured to fit through a central aperture 112 in conditioning disk 88 and then through a central aperture 114 in magnetic disk 86. Locating key 110 is properly designed such that the disks will be aligned with each other upon joining. In the particular example as illustrated in FIG. 7, a hexagonal key is used as the locating key, where the hexagonal shape will prevent the movement of conditioning disk 88 with respect to magnetic disk 86. The joined components are then attached to the underside of impeller assembly 84, where a central locking element 116 of impeller assembly 84 functions to align the apertures 96, 98 of magnetic disk 86 and conditioning pad 88 with apertures 94 and/or vacuum ports 100 of each impeller blade 90-*n*. By virtue of the large number of apertures formed within magnetic disk 86 and conditioning disk 88, the ease of alignment between the apertures of these components with apertures 94 and/or vacuum ports 100 is enhanced. Referring to FIG. 7, a pair of locking pins 120, 122 of central locking element 116 extend through the assembled components and are then inserted in mating openings 124, 126 formed in central locating key 110. A screw or other attachment means may be inserted through central opening 130 of central locating key 110 to central locking element 116 to mechanically secure the arrangement. FIG. 9 also contains a view of this locking arrangement as seen from the bottom of the arrangement. Although a hexagonal locating shape is illustrated in FIG. 7, it is to be understood that other geometries may be used in the formation of central locating key 110, for the purpose of creating a mechanical attachment, properly aligning the tooling of the system and providing for transfer of the drive/rotational force to the conditioning assembly. Moreover, the locking mechanical attachment has been found to prevent misalignment of conditioning disk 88 with respect to gimbaled impeller assembly 84, thus maintaining an essentially parallel relationship that limits uneven polishing pad wear.

In one embodiment of the present invention, a pressurized source 128 is coupled to impeller arrangement 80 and used to impart an impulse function to the streams of slurry/conditioning agent being applied to the polishing pad. The use of a megasonic stream will advantageously dislodge contaminants that have become embedded in the top surface, fibers and/or pores of the polishing pad being conditioned. The presence of the vacuum then allows for these dislodged contaminants to be quickly and efficiently removed from the surface of the polishing pad. There exist various arrangements that may be used to provide for the megasonic streams, such as the use of a separate pressurizing element for each impeller blade. Referring to FIG. 7, a piezo-electric driver 99 may be included within impeller blade 90-*n* to provide sonic energy and excite the flow of the conditioning agent. Alternatively, one pressurizing source (such as element 128) may be used to impart an impulse pressurized force for the stream of conditioning agent(s) introduced through the inlet port.

Figure 11:
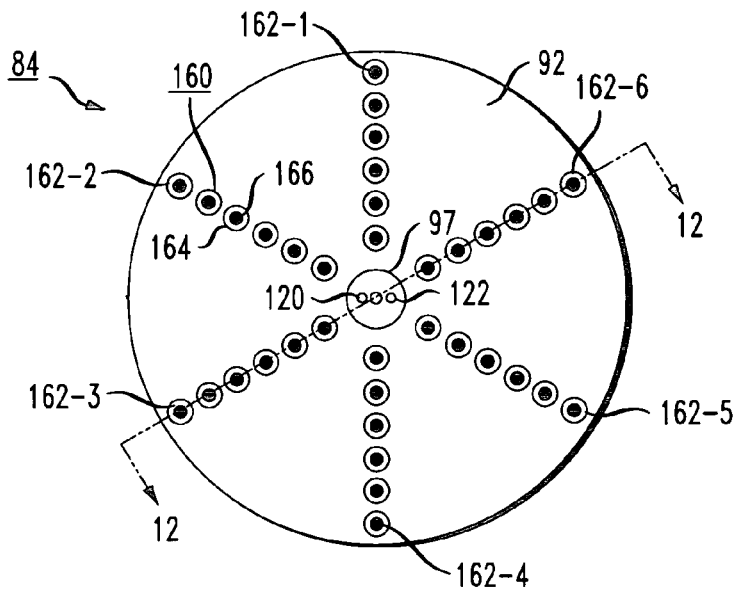
FIG. 11 illustrates an alternative impeller element configuration, using cylindrical members instead of impeller blades.
Figure 12:
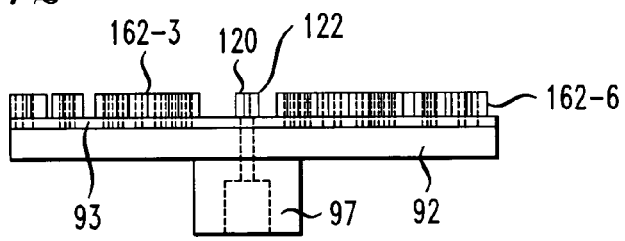
FIG. 12 is a side view of the arrangement of FIG. 111

FIG. 11 illustrates, in a bottom view, an alternative embodiment of impeller assembly 84 of the present invention. FIG. 12 is a cut-away side view of this embodiment, taken along line 12-12 of FIG. 11. In this case, impeller blades 90 are replaced by a plurality of separate impeller elements 160, each element being cylindrical in form (see FIG. 12), including a central aperture 164 for dispensing the conditioning agent(s) surrounded by a cylindrical encasement 166. As with the embodiments described above, the precise location and size of each impeller element 160 is at the discretion of the system designer. In the embodiment of FIG. 11, the plurality of impeller elements 160 are arranged as a set of "spokes" 162. That is, separate sets of impeller elements 160 are disposed in linear fashion, extending outward from center member 97, forming spokes 162-1 through 162-6. With particular reference to FIG. 12, a channel 168 may be formed within upper holding member 92 to provide a path for the conditioning agent(s) to flow and be dispensed through apertures 164 of impeller elements 160. Therefore, similar to the blade embodiment described above, this arrangement of impeller elements 160 forms a set of six separate segments that will allow for efficient application of the conditioning agent(s) and/or vacuum removal of the effluent. It is to be presumed that the arrangement of impeller elements 160 is controlled to the extent that central apertures 164 will align with apertures 96 and 98 of magnetic disk 86 and conditioning disk 88, respectively.

Figure 13:
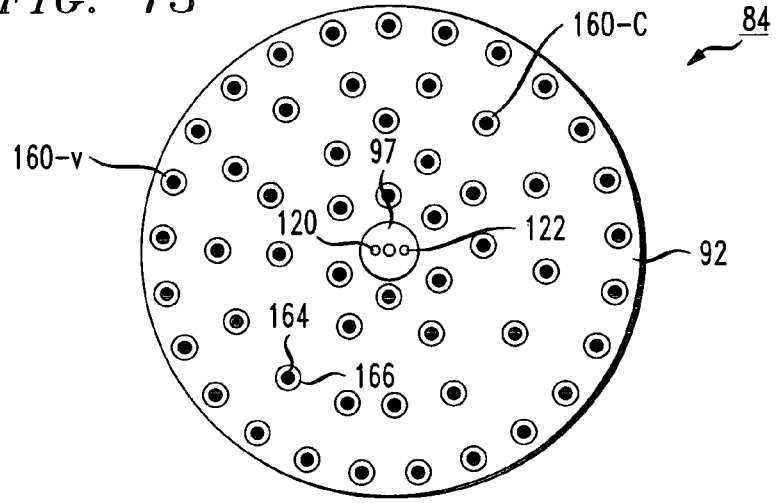
FIG. 13 illustrates an alternative arrangement of the cylindrical impeller elements as shown in FIGS. 11 and 12.

FIG. 13 illustrates an alternative embodiment of impeller assembly 84 that comprises a plurality of separate impeller elements 160 disposed in a more random pattern across the surface of upper holding member 92. In this case, a different channel configuration would be required to ensure that each impeller element 160 desired to be used to dispense conditioning agent(s) is in contact with a channel. In the particular embodiment of FIG. 13, a first set of impeller elements 160-V may be disposed around the perimeter of upper holding member 92 and coupled to a vacuum channel (similar to channel 101 discussed in association with FIG. 10) to evacuate effluent from the surface of a polishing pad. The remainder of the impeller elements, designated as 160-C, would then be used to dispense the conditioning agent(s).

It is to be understood that the various embodiments of the impeller assembly discussed hereinabove are exemplary only, and it is to be understood that various other arrangements for dispensing conditioning agent(s) and/or evacuating effluent are considered to fall within the spirit and scope of the present invention.

In comparison to prior art conditioning processes and systems, the arrangement of the present invention provides for the conditioning and associated polishing processes to be considerably more efficient. In particular, the inventive arrangement uses significantly less materials (e.g., polishing slurry, cleaning/rinsing agents) to perform the polishing and conditioning operations. Typical wafer polishing processes require the dispensing of anywhere from about 140-250 ml/minute of polishing slurry to provide stable polishing, since a portion of the reacted slurry remains in the sponge-like pores of the pad after each rotation. Using the conditioning arrangement of the present invention, the pores of the polishing pad are thoroughly cleaned of reacted slurry, presenting the pad as a "fresh", dry sponge for the introduction of the next dispensing of polishing slurry.

As a result of the absence of reacted and "new" slurry within the pores of the polishing pad, less slurry is required to perform the same amount of polishing. For example, a polishing flow on the order of 75-100 ml/min has been found acceptable for systems formed in accordance with the present invention. It is to be understood that similar reductions in the amounts and flow rates of various conditioning agents can also be expected.

Figure 14:
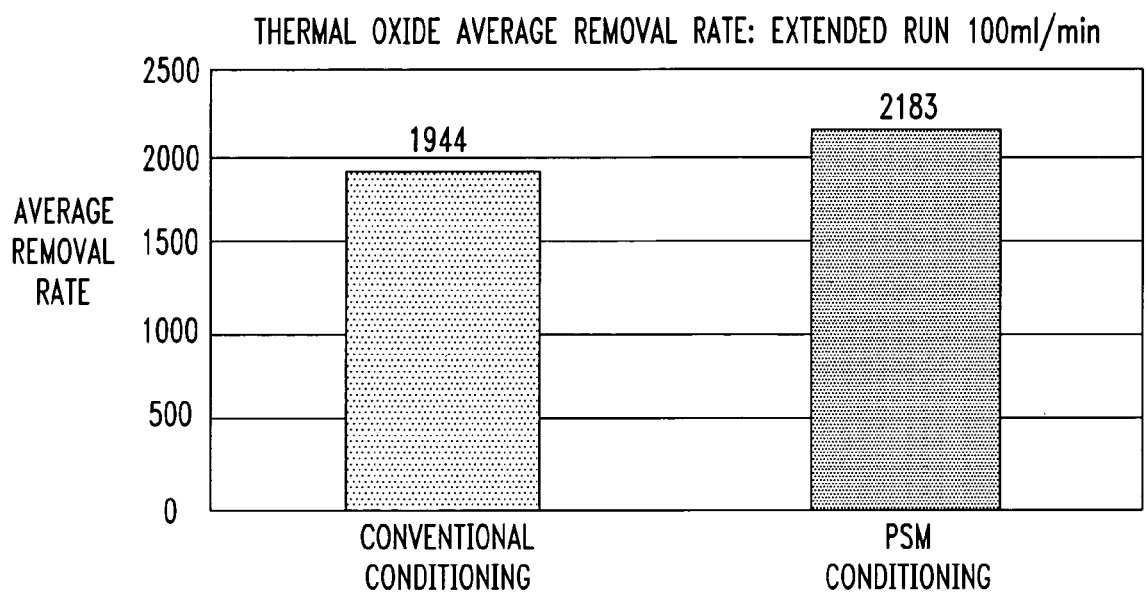
FIG. 14 is a graph illustrating improved polishing pad removal rate when using the polishing pad conditioning system of the present invention.
Figure 15:
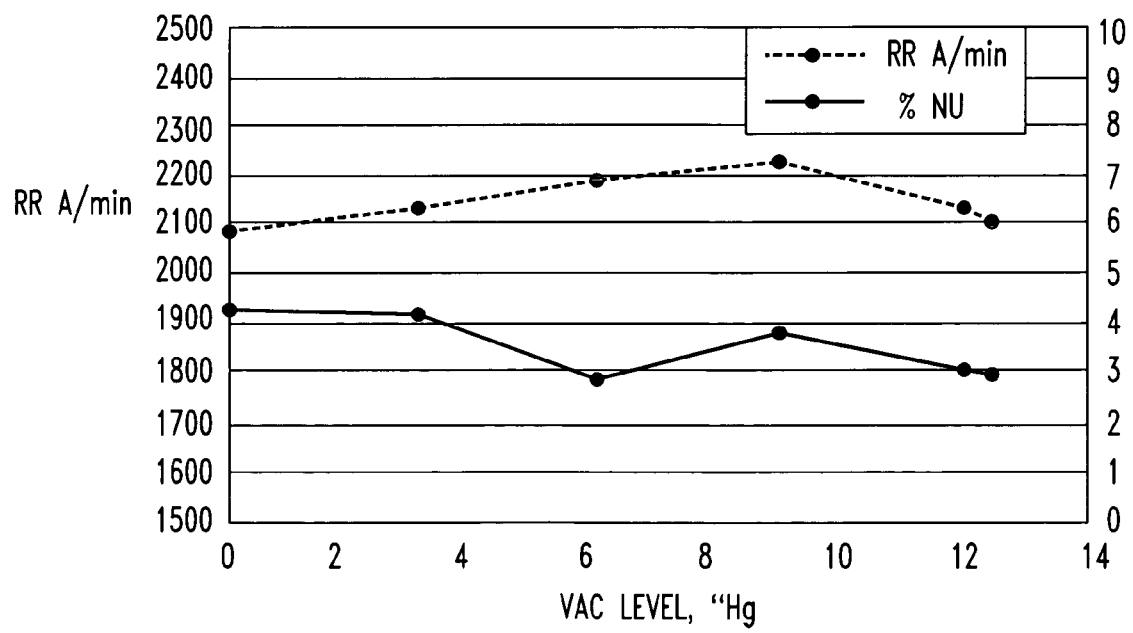
FIG. 15 is a graph illustrating improved polishing slurry activity as a function of the vacuum force applied during the conditioning process.

The improvement of using a "recharged", clean pad during each polishing operation may also be analyzed in terms of the amount of material actually removed during the polishing operation (defined as the removal rate and measured in Å/min). FIG. 14 contains a graph comparing the average thermal oxide removal rate for a conventional prior art conditioning system vs. the conditioning system of the present invention, the graph based on an extended polishing run utilizing a flow rate for the polishing slurry of 100 ml/min. As shown, the average removal rate for the prior art was about 1944 Å/min, compared to a removal rate of 2183 Å/min for an arrangement formed in accordance with the present invention. FIG. 15 contains a graph of the removal rate (in this case, thermal oxide polishing), as a function of the vacuum level applied to the pad during the conditioning process. In this particular case, a 5-7% increase in removal rate was found for a vacuum in the range of 6"-9" Hg. Further, the consumption of conditioning agents and/or rinsing water is also reduced, for the same reasons, particularly with respect to the use of a vacuum to draw the effluent through the apertures. Other results, of course, could be possible in other systems.

As a result of the need to use less conditioning agent and/or rinse agent, and because the effluent is captured from the pad surface and not diluted with other machine wastes, the amount of polished film material (for example, copper) present in the evacuated material is much more concentrated. Therefore, the waste material may preferably be segregated and processed, allowing for a significant amount of the polished film material (i.e., copper) to be reclaimed. Additionally, a chemical analyzer may be included as part of the waste removal system and used to provide in situ determination of the end point of the polishing process. That is, by monitoring the concentration of various components of film material present in the waste stream, the point where a wafer substrate is reached, or where a bulk film layer has been completely removed, can be determined.

Figure 16A:
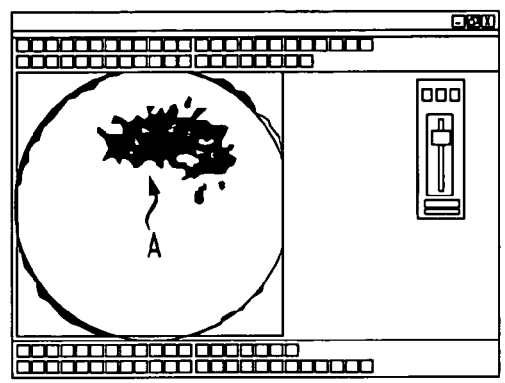
FIGS. 16(*a*) and (*b*) contain photographs of the pressure gradient across the surface of an abrasive conditioning disk, FIG. 16(*a*) associated with the prior art and FIG. 16(*b*) associated with an embodiment of the present invention.
Figure 16B:
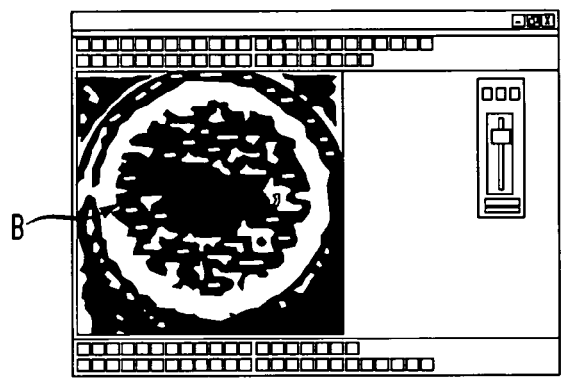

Yet another feature of impeller arrangement 80 of the present invention is the possibility of modifying sealing surface 131 of outer chamber 82 to provide for a dynamic seal between the conditioning apparatus and the polishing pad surface. In this case, outer chamber 82 is attached as a "floating" member to an end effector arm supporting the conditioning apparatus (such as end effector arm 16 of FIG. 1). In one embodiment the "floating" outer chamber may include a solid sealing surface, particularly well-suited for use with grooved polishing pads. When used with perforated polishing pads, this sealing surface may be textured. Advantageously, the use of a vacuum system to remove spent conditioning agent and contaminants allows for a vacuum seal to be created between outer chamber 82 and the polishing pad. This vacuum force, in the embodiment where it is applied in the vacuum regions between adjacent impeller blades, maintains an essentially co-planar interface between conditioning disk 88 and the surface of the polishing pad, where improved co-planarity will allow for improved uniformity of the abrasive pressure and orientation of conditioning disk 88 (e.g., flatness/diamond furrow density/surface profile) and improved uniformity with respect to removal of contaminants from the polishing pad. Moreover, the use of vacuum seal between outer chamber 82 and the polishing pad will reduce the amount of "plowing" that occurs in conventional systems when the gimbaled conditioning apparatus rotates or tilts slightly toward the leading edge in response to sliding contact/friction with the surface of the polishing pad. FIGS. 16(a) and (b) contain illustrations of the contact pressure between a conditioning disk and polishing pad surface, where FIG. 16(a) is associated with a prior art conditioning system and FIG. 16(b) is associated with a conditioning system formed in accordance with the present invention. These pictures were obtained using a Tekscan force measurement array. A conventional conditioner was mounted on an IPEC 372M CMP tool, and contact force measurements were taken over increasing loads. FIG. 16(a) clearly illustrates a localized high pressure zone A (i.e., "plowing") that is associated with the leading radius of the conditioner. The vacuum enhanced conditioning system of the present invention was similarly tested, with a constant mechanical downforce, and increasing vacuum "loads". The resultant force plot of FIG. 16(b) clearly illustrates uniform loads (denoted as area "B") over the entire abrasive surface.

Additionally, the controlled application of a bi-directional force (i.e., upward force through the effector arm on the conditioning system and downward vacuum applied force), in accordance with the present invention, allows for better control of the resultant force (this resultant force being maintained, for example, between 0 and 50 pounds). In particular, by dynamically controlling the "negative pressure" of the vacuum force, the actual vacuum can be modified as desired to provide for more efficient contaminant removal, as noted above, without creating excessive or additional force on the abrasive that would then lead to undesirable higher polishing pad removal rates.

In general, the use and control of the bi-directional force allows for closed loop control of the polishing pad removal rate via parameters such as torque, speed, displacement, force, "z" and "x/y" position, etc. The conditioning arm may further include, as part of this closed loop control system, multi-axis force instrumentation that provides for high resolution and dynamic resultant downforce and torsional moment measurements, all used as feedback information to the closed loop system. For example, a "tilt" sensor with sufficient resolution may be used to measure the angle of the conditioning arm and/or the angle of the polishing cup to determine the relative "z" position of the system with respect to the polishing pad surface. There exist various types of miniature tilt sensors (e.g., uniaxial, biaxial, triaxial, accelerometers, MEMS, capacitance and/or optical approaches) with a resolution sufficient to measure this tilt with an accuracy better than systems that utilize eddy current measurements or laser-based orientation measurements. Commercially available miniature tilt sensors may provide this measurement, in fact, with sub-micron precision. For example, if the total pad life is ±20° (or ±7200 seconds of angle), this is the equivalent of a vertical measurement of 1270 microns. Therefore, one second of tilt is a) proximately equal to 0.0001 microns of displacement. In one embodiment, a tilt sensor is mounted in the Divot end of a conditioning arm, where the tilt measurement thus provides an angular measurement of the arm position relative to the polishing pad surface the profile of the polishing pad surface can therefore be monitored to characterize situations such as, for example, when pad "break-in" is completed when pad "end of life" has occurred, or in the performance of closed-loop profiting of polishing time and/or downforce(s) applied to the polishing pad at a particular point in time to achieve a conditioned pad surface.

Figure 17:
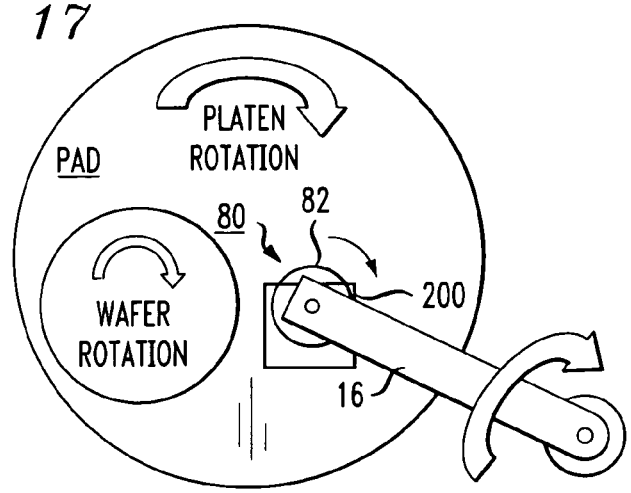
FIG. 17 is a simplified top view of a CMP apparatus illustrating the location of an abrasive conditioning disk torque measuring apparatus, used in accordance with the present invention to determine physical parameters of the polishing pad.

FIG. 17 contains a simplified diagram illustrating the use of abrasive torque instrumentation 200, used to measure the rotational torque of abrasive conditioning disk drive motor 81 as conditioning system 80 is pivoted across the platen radius of a CMP tool, where changes in rotational torque can be directly correlated to changes in polishing pad thickness. The abrasive torque measurement and conditioning pad wear measurement systems may be included in the closed loop system to monitor the "lifetime" of the polishing pad and provide data regarding end of life detection. Typically, polishing pad life is specified/controlled in terms of number of wafers processed. This is often a conservative approximation and does not account for variations such as, for example, break-in, interruptions, abrasive sharpness, wafer film variations, etc. By measuring the actual surface profile and remaining thickness of the polishing pad in situ, a much more accurate end of life control mechanism is obtained. In particular, the torque of the abrasive conditioning disk drive motor 81 may be measured and analyzed with respect to vertical displacement/abrasive wear, resultant downforce (i.e., combination of vacuum-generated force and mechanically-supplied force), rotational speed, and pad sweep position (radius) to determine the Preston constant (K). This measurement of rotational torque on abrasive drive motor 81 is a unique distinction in comparison to the prior art, where the torque measurements are made at the pivot arm (the pivot arm measurements considered as being a less accurate indication of the actual attributes of the abrasive conditioning disk). This analysis of the motor torque then yields the ability to control downforces and speeds in different radial positions across the polishing pad so as to better manage removal rate and overall polishing pad surface planarity.

Figure 6:
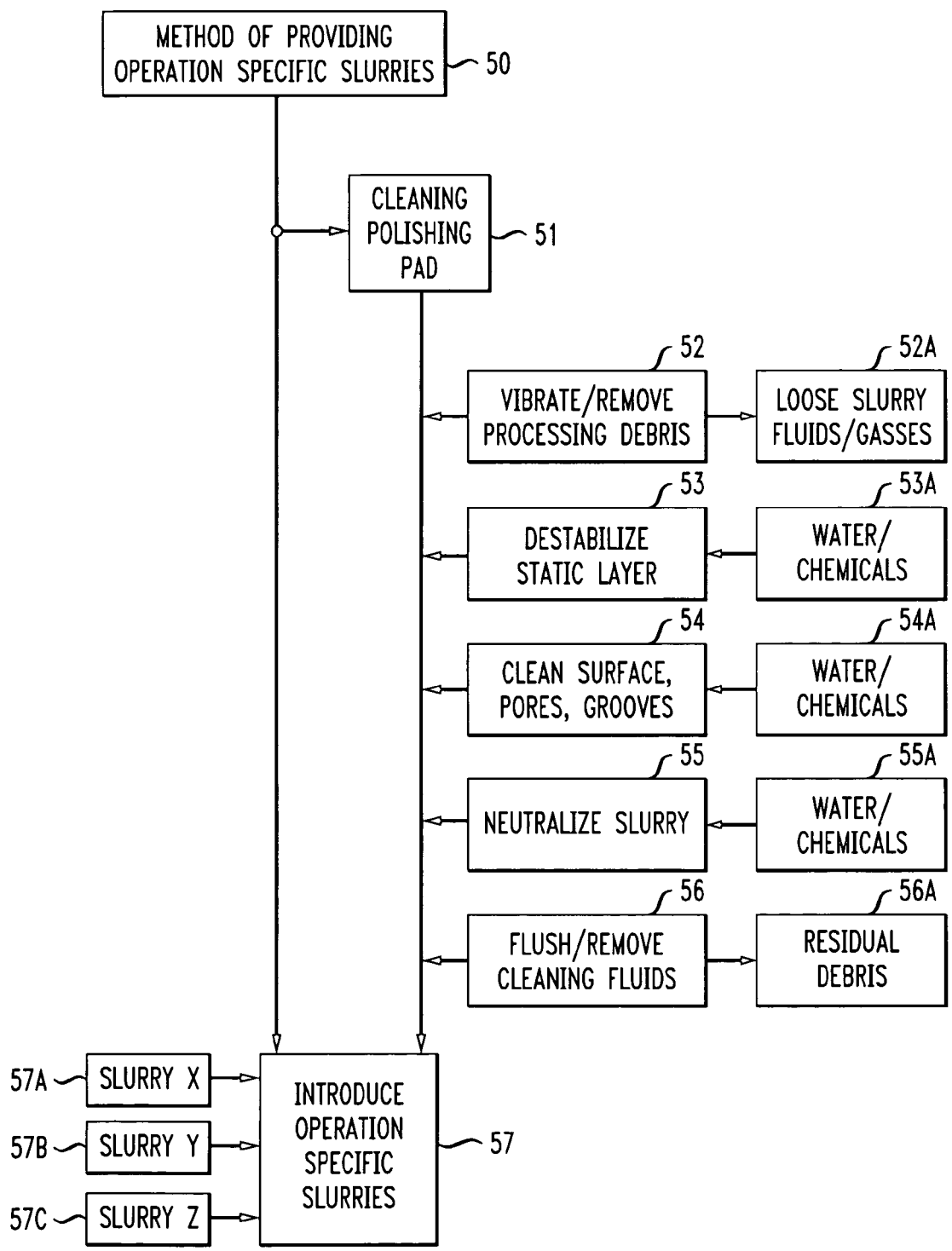
FIG. 6 is a block diagram showing the method of the present invention.

The method of providing operation specific slurries 50 of the present invention is shown in the block diagram of FIG. 6. Cleaning the polishing pad 51 in process is comprised of at least five operations run in parallel, sequentially or any combination. This operation can be run in-situ or ex-situ, and can support dynamic in-process pH adjustments to control removal rate and/or endpoint selectivity. The polishing pad 12 is subjected to a vibratory motion 52 to remove processing debris of loose slurry, fluids, and gasses 52A. The static layer that may remain is destabilized 53 with vacuum, water and other chemicals 53A. The polishing pad surface, pores, and grooves 54 are then cleaned with vacuum, water and chemicals 54A. A further step involves neutralizing the slurry 55 residue on the pad surface with water and other chemicals 55A. The final step is flushing 56 to remove cleansing fluids and any remaining debris 56A. With the conditioning apparatus thoroughly cleaned, other operation specific slurries 57A, 57B, and 57C may be introduced to the process via slurry feed system or at 57 to the conditioning apparatus 10.

The invention claimed is:

1. An apparatus for conditioning a polishing pad used in a chemical-mechanical polishing (CMP) process, the apparatus comprising
    an abrasive conditioning disk including a plurality of apertures formed therethrough;
    an inlet port for introducing fluid and/or gaseous conditioning agent(s) into the apparatus; and
    an impeller assembly disposed between the abrasive conditioning disk and the inlet port, the impeller assembly including at least one impeller element comprising a plurality of cylindrical members, each having a central aperture and surrounding encasement for introducing fluid and/or gaseous conditioning agent(s) onto a polishing pad through said plurality of apertures formed through said conditioning disk.

2. The apparatus as defined in claim 1 wherein the plurality of cylindrical members are disposed in a predetermined pattern across the impeller assembly.

3. The apparatus as defined in claim 1 wherein the predetermined pattern comprises sets of linearly disposed impeller elements, extending outwardly as spokes from the center of the impeller assembly.

4. The apparatus as defined in claim 1 wherein the plurality of cylindrical members are disposed in a random arrangement across the impeller assembly.

5. The apparatus as defined in claim 1 wherein the at least one impeller assembly further comprises at least one impeller blade, the at least one impeller blade disposed outwardly from the center of the impeller assembly and extending perpendicularly above the conditioning disk, said at least one impeller blade including
    an interior channel along at least a portion thereof, coupled at a first end to the inlet port and terminating through at least one aperture formed in the bottom surface of said at least one impeller blade.

6. The apparatus as defined in claim 5 wherein the impeller assembly comprises a plurality of impeller blades, disposed in a radial pattern and extending outwardly from the center of the impeller assembly, with a separation between adjacent impeller blades.

7. The apparatus as defined in claim 6 wherein at least two impeller blades of the plurality of impeller blades include at least one aperture for application of the conditioning agent(s).

8. The apparatus as defined in claim 1 wherein the apparatus further comprises a support disk disposed between the abrasive conditioning disk and the impeller assembly, the support disk comprising a plurality of apertures that align with the abrasive conditioning disk plurality of apertures.

9. The apparatus as defined in claim 8 wherein the support disk comprises a magnetic material for providing a fixed attachment of the support disk to the abrasive conditioning disk.

10. The apparatus as defined in claim 8 wherein the apparatus further comprises a central locating key for coupling to the support disk and the abrasive conditioning disk, said support disk and said abrasive conditioning disk both including a central locating key opening; and the impeller assembly including a central locking element, the central locking element for mating with the central locating key through the support disk and the abrasive conditioning disk central locating key openings, so as to transfer rotational energy from said impeller assembly to said conditioning disk.

11. The apparatus as defined in claim 10 wherein the central locating key opening, the central locating key and the central locking element exhibit a hexagonal form.

12. The apparatus as defined in claim 1 wherein the apparatus further comprises a central locating key for coupling to the abrasive conditioning disk, said abrasive conditioning disk including a central locating key opening; and the impeller assembly including a central locking element, the central locking element for mating with the central locating key through the abrasive conditioning disk, so as to transfer rotational energy from said impeller assembly to said conditioning disk.

13. The apparatus as defined in claim 1 wherein the apparatus further comprises a pressurized source coupled to said at least one impeller element for imparting pressurized energy to the fluid and/or gaseous energy to the conditioning agent(s).

14. The apparatus as defined in claim 13 wherein the pressurized source comprises at least one piezo-electric megasonic energy source coupled to at least one impeller element for imparting pressurized megasonic energy to the conditioning agent(s).

15. The apparatus as defined in claim 13 wherein the pressurized source comprises a single pressurized source, coupled to the introduced stream of conditioning agent(s) for imparting pressurized energy to the conditioning agent(s).

* * * * *